United States Patent [19]
Douillard et al.

[11] Patent Number: 6,108,388
[45] Date of Patent: Aug. 22, 2000

[54] ITERATIVE-STRUCTURE DIGITAL SIGNAL RECEPTION DEVICE, AND MODULE AND METHOD THEREFOR

[75] Inventors: Catherine Douillard, Brest; Alain Glavieux, Brest Cédex; Michel Jezequel, Brest; Claude Berrou, Locamaria-Plouzane, all of France

[73] Assignees: France Telecom; Telediffusion de France, both of Paris, France

[21] Appl. No.: 08/894,207

[22] PCT Filed: Feb. 6, 1996

[86] PCT No.: PCT/FR96/00197

§ 371 Date: Dec. 3, 1997

§ 102(e) Date: Dec. 3, 1997

[87] PCT Pub. No.: WO96/24999

PCT Pub. Date: Aug. 15, 1996

[30] Foreign Application Priority Data

Feb. 7, 1995 [FR] France ................................. 95 01603

[51] Int. Cl.$^7$ .............................. H03D 1/06; H04L 27/06
[52] U.S. Cl. .......................................... 375/348; 375/341
[58] Field of Search ...................................... 375/262, 341, 375/232, 233, 340, 346, 348; 371/43

[56] References Cited

U.S. PATENT DOCUMENTS

| | | | |
|---|---|---|---|
| 5,353,307 | 10/1994 | Lesteer et al. | 375/232 |
| 5,446,747 | 8/1995 | Berrou | 371/43 |
| 5,513,216 | 4/1996 | Gadot et al. | 375/233 |
| 5,537,436 | 7/1996 | Bottoms et al. | 375/261 |
| 5,537,441 | 7/1996 | Bremer et al. | 375/261 |
| 5,684,834 | 11/1997 | Betts et al. | 375/261 |
| 5,719,923 | 2/1998 | Bremer et al. | 379/93 |

FOREIGN PATENT DOCUMENTS

| | | |
|---|---|---|
| 0 511 141 A1 | 10/1992 | European Pat. Off. |
| 0 524 597 A1 | 1/1993 | European Pat. Off. |
| WO 91/06165 | 5/1991 | WIPO . |

OTHER PUBLICATIONS

Claude Berrou, et al., *ICC'93 Geneva*, IEEE International Conference on Communications '93, Technical Program Conference Record, vol. 2/3, May 23–26, 1993, Geneva, Switzerland, pp. 1065–1070.

Hidekazu Murata et al., Performance of Adaptive Equalizer Using Iterative Application of Viterbi Algorithm, Electronics and Communications in Japan, Part 1, vol. 77, No. 4, Apr. 1994, pp. 103–110.

J.W.M. Bergmans et al., On the Use of Decision Feedback for Simplifying the Viterbi Detector, Philips Journal of Research, vol. 42, No. 4, 1987, pp. 428–399.

Jianjun Wu, et al., A Channel Model and A Novel Adaptive Equalizer for Mobile Radio Communications, IEEE in Houston, Globecom '93, IEE Global Telecommunications Conference, Nov. 29–Dec. 2, 1993, vol. 1 of 4, pp. 98–102.

Peter Jung, et al., VLSI Implementation of Soft Output Viterbi Equalizers For Mobile Radio Applications, Vehicular Technology Society 42$^{nd}$ VTS Conference Frontiers of Technology, vol. 2 of 2, May 10–13, 1992, Denver Colorado, pp. 577–585.

*Primary Examiner*—Tesfaldet Bocure
*Attorney, Agent, or Firm*—Kinney & Lange, P.A.

[57] ABSTRACT

The invention relates to a device for the reception of signals formed by a series of digital symbols corresponding to the convolutive encoding of items of source digital data comprising p cascade-connected detection and decoding modules $M_1$ to $M_p$, p being greater than or equal to 2, each of said modules $M_i$ including: (a) inter-symbol interference correction means supplied by a symbol input $R_i$ and delivering estimated symbols $A_{i,1}$ with weighted values, (b) means for the decoding of said estimated symbols $A_{i,1}$, performing operations symmetrical to said convolutive encoding and delivering decoded symbols $A_{i,2}$ with weighted values, and (c) means for the computation of an item of correction information $Z_{i+1}$ from said estimated symbol $A_{i,1}$ and said decoded symbol $A_{i,2}$, (d) said means for the correction of each of said modules $M_i$, except for the first module $M_1$, taking account of at least one item of correction information $Z_i$ determined by the previous module $M_{i-1}$.

9 Claims, 3 Drawing Sheets

ITERATIVE-STRUCTURE DIGITAL SIGNAL RECEPTION DEVICE, AND MODULE AND METHOD THEREFOR

BACKGROUND OF INVENTION

The field of the invention is that of the transmission and broadcasting of digital signals, especially in the presence of transmission noises. More specifically, the invention relates to the reception of digital signals encoded by means of a convolutive type error correction code.

The invention can be applied in all cases where digital signals are transmitted or broadcast on noise-infested channels. For example, the present invention can be implemented in receivers of systems for digital radiocommunications with mobile units such as the GSM system.

Other possible applications are, for example, the reception of signals transmitted by RF channels, satellites, etc. More generally, the invention can be applied advantageously in all cases where a convolutive type code is implemented at transmission.

In the known type of receivers, the symbols retrieved at output of the demodulator take the form of analog samples which, after quantification, are generally processed by an equalizer (a transversal filter) given the task of eliminating the inter-symbol interference introduced by the channel. The equalized samples are then de-interleaved if necessary and decoded before being given to the addressee.

The principle of equalization consists in estimating the response of the transmission channel for the application, to the received signal, of a filtering operation symmetrical to this response so as to: obtain a corrected signal. In particular, the equalization is aimed at eliminating or, at least, at limiting the inter-symbol interference introduced by the channel.

The response of the channel is generally estimated by the analysis of a reference signal known to the receivers. Of course, the transmission of these reference signals leads to a reduction of the useful bit rate.

The equalized items of data are then de-interleaved (in an operation symmetrical to the interleaving done at the time of encoding, if such an interleaving is planned) and then decoded.

In certain situations, it happens that the equalization of this type is not sufficient to ensure high quality source decoding.

The article by P. Jung and P. W. Baier, "VLSI implementation of soft output Viterbi equalizers for mobile radio applications" (Proc. of IEEE 42nd Vehicular Technology Society Conference, Denver, Colo., pp. 577–585, May 1992) proposes the use, instead of a transversal filter, of a symbol detector working according to the principle of maximum likelihood.

This technique is more efficient if the coefficients representing the channel are properly estimated. However, once again, the equalized items of data may prove to be of insufficient quality. Furthermore, it is more complicated to make and requires more space than with the transverse filter technique.

Convolutive codes are codes that associate at least one encoded item of data with each item of source data to be encoded. This encoded item of data is obtained by the modulo 2 summation of this item of source data with at least one of the previous items of source data. Thus, each encoded signal is a linear combination of the item of source data to be encoded and previous items of source data taken into account.

In the decoder, the original items of data are most usually reconstructed by means of a maximum likelihood algorithm, for example the Viterbi algorithm, whose decisions may be weighted if necessary. The Viterbi algorithm, in taking account of a sequence of received encoded symbols, provides an estimation of each item of data encoded at transmission, in defining the source sequence most probably corresponding to the received sequence.

The Viterbi algorithm may also be used to detect sequences affected by inter-symbol interference. The invention can be also applied in this case.

Clearly, the greater the number of symbols taken into account, the more reliable is the decision. By contrast, the greater this number, the more complicated is the decoder or the detector (hereinafter, the term « decoder » is used to describe decoders themselves as well as detectors. This observation is applicable also to the term « decoding » which must be understood to mean « decoding » or « detection » as the case may be. The memory space needed soon becomes very great, as do the corresponding computation times.

The integrated circuits that implement such algorithms therefore most usually rely on a compromise between cost and performance. These industrial-level choices do not always enable the construction of decoders that correspond in an optimum way to a given application. For example, it is not possible to make low-cost decoders for applications where the reception quality is not of crucial importance, as integrated circuits cost too much. Conversely, these integrated circuits too are not suited to the making of receivers with very high decoding quality for which the cost price is of little importance.

An advantageous example of convolutive encoding, to which the invention can be applied, is described in the French patent application FR 91 05280 filed on behalf of the same Applicants as well as in the article by C. Berrou, A. Glavieux and P. Thitimajshima, "Near Shannon limit error-correcting coding and decoding: turbo-codes" (Proc. ICC'93, pp. 1064–1070, Geneva, Switzerland, May 1993). This class of codes is known in particular as "turbo-codes".

The elementary codes (recursive systematic or pseudo-systematic codes) described in the French patent application FR 91 05278 filed on behalf of the present Applicants may also be used.

The invention is aimed especially at overcoming the drawbacks of the prior art reception device and more specifically at improving the corresponding performance characteristics.

More specifically, a goal of the invention is to provide a device of this kind with very high corrective capacity as compared with known methods presently used in digital communications systems.

The invention is aimed in particular at providing methods of this kind that are particularly efficient, again with respect to known methods, for transmission in highly noise-infested channels.

It is also an aim of the invention to provide a device of this kind that is highly efficient but nevertheless easy to manufacture on an industrial scale at acceptable costs.

Thus, a particular aim of the invention is to provide a decoding method enabling implantation on a silicon surface that is small enough for its industrial-scale manufacture to be possible, for example, on a surface area smaller than 50 $mm^2$.

It is also an aim of the invention to provide a method of reception used for the making of numerous types of receivers with performance characteristics and cost price that vary as a function of the needs fulfilled, implementing one or more integrated circuits of a single type.

In other words, an essential aim of the invention is to provide methods of this kind enabling firstly profitable industrial-scale manufacture based on the development of a single and relatively simple integrated circuit and, secondly, the making of receivers that can be used for a very wide variety of applications.

BRIEF SUMMARY OF THE INVENTION

These goals as well as others that shall appear hereinafter are achieved according to the invention by means of a device for the reception of signals formed by a series of digital symbols corresponding to the convolutive encoding of items of source digital data comprising p cascade-connected detection and decoding modules $M_1$ to $M_p$, p being greater than or equal to 2, each of said modules $M_i$ including:

inter-symbol interference correction means supplied by a symbol input $R_i$ and delivering estimated symbols $A_{i,1}$ with weighted values, means for the decoding of said estimated symbols $A_{i,1}$, performing operations symmetrical to said convolutive encoding and delivering decoded symbols $A_{i,2}$ with weighted values, and means for the computation of an item of correction information $Z_{i+1}$ from said estimated symbol $A_{i,1}$ and said decoded symbol $A_{i,2}$, said means for the correction of each of said modules $M_i$, except for the first module $M_1$, taking account of at least one item of correction information $Z_i$ determined by the previous module $M_{i-1}$.

Thus, according to the invention, the standard function of equalization (filtering) is replaced by a symbol detector that takes account of the memory effect introduced by the channel.

In other words, the invention proposes a completely novel and optimized approach to the correction of inter-symbol interference. Indeed, conventionally, the equalization does not take account of the items of data transmitted but only of the channel estimation. By contrast, the invention is based on a dynamic approach, in taking account of the last symbols received to improve the equalization.

In other words again, the invention, in its general principle, likens the effect of inter-symbol interference to a particular convolutive encoding (except that there is no redundancy in the case of interference: to a symbol emitted on the channel, there corresponds one and only received symbol), and carries out its decoding. More specifically, the phenomenon of inter-symbol interference introduced by the channel may be represented by a lattice. This lattice differs from a convolutive encoding lattice by the presence of multiplier coefficients that vary in time. Thus, each module of the invention includes correction means and decoding means having similar structures based on convolutive decoding techniques.

The technique of the invention therefore consists in computing an item of correction information that represents the received symbol and in taking account of one or more of these items of information to correct the interference.

It will be understood that the taking into account of this information element dictates an iterative reception structure because of the latency introduced by the processing operations. Thus, during the first iteration, a first item of correction information is computed. This information element is used and, as the case may be, it is recomputed during the following iterations. According to the invention, the iterative approach takes the form of a structuring of the receiver (detector of symbols and decoder) in the form of cascade-connected modules with each module corresponding to an iteration. This is a completely novel approach to the correction of inter-symbol interference.

Advantageously, these modules are all identical. In particular, they may take the form of integrated circuits.

The greater the number of modules, the greater is the increase in the efficiency of reception (correction of inter-symbol interference and decoding). The modular approach of the invention can be used to easily obtain several types of receivers corresponding to different levels of reception quality, as a function of the modules implemented. Similarly, it is possible to provide for decoders with an open-ended structure to which modules may be added as needed.

DESCRIPTION OF THE DRAWINGS

Other features and advantages of the invention shall appear from the following description of a preferred embodiment of the invention giving by way of a non-restricted example and from the appended drawings, of which.

DETAILED DESCRIPTION OF THE PREFERRED EMBODIMENTS

Figure 1:
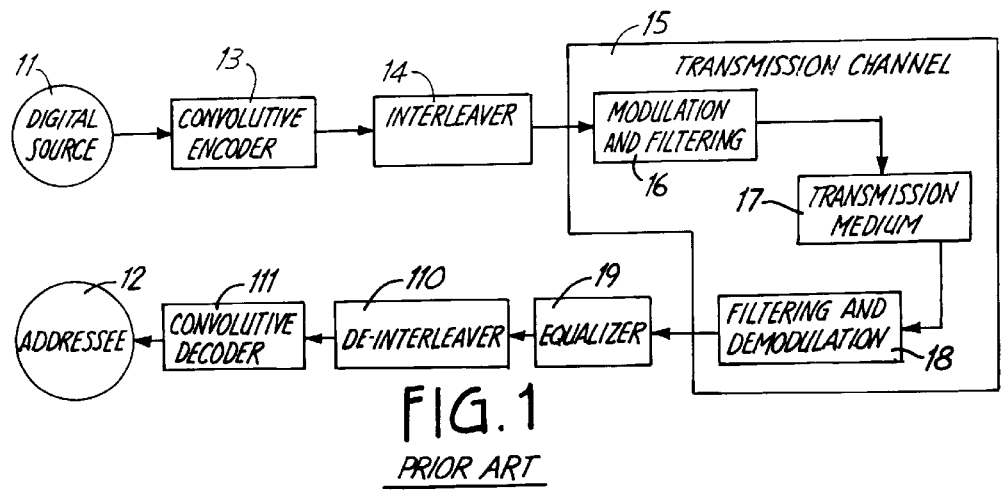
FIG. 1 is a block diagram illustrating a standard transmission line that can incorporate the reception device according to the present invention.

According to a preferred embodiment of the invention, each of said modules $M_i$ has two inputs, one symbol input $R_i$ and one correction input $Z_i$ and three outputs, one symbol output $R_{i+1}$, one correction output $Z_{i+1}$ and one decoded symbol output $D_{i+1}$, the symbol input $R_i$ of the module $M_i$ being connected to the symbol output $R_i$ of the module $M_{i-1}$ for i greater than 1 and being supplied with the symbols received for i equal to 1, the correction input $Z_i$ of the module $M_i$ being connected to the correction output $Z_i$ of the module $M_{i-1}$ for i greater than 1 and being supplied with a neutral value that does not affect the correction for i equal to 1, the symbol output $R_{i+1}$ of the module $M_i$ being equal to the symbol input $R_i$ of said module $M_i$ delayed by the latency time dictated by the module $M_i$, the correction output $Z_{i+1}$ delivering said correction information, and the decoded symbol output $D_{i+1}$ being unused for the modules $M_1$ to $M_{p-1}$ and being supplied with the decoded symbol $A_{p,2}$ of the module $M_p$ if the code implemented is a systematic code and, if not, with a corresponding reconstituted value.

This structure, as indicated further above, makes it possible to design identical modules. Of course, depending on whether it is the first module, the last module or an intermediate module, the inputs and outputs used may be different.

Advantageously, said means for the correction of the inter-symbol interference are supplied with an item of correction information $Z_i$ representing a difference between each decoded symbol $A_{i,2}$ and the corresponding estimated symbol $A_{i,1}$.

In this case, preferably, said means to compute the item of correction information comprise means for the multiplication of said estimation symbols $A_{i,1}$ by a positive weighting coefficient $\gamma_2$ delivering weighted symbols, and subtraction means computing the difference between each decoded symbol $A_{i,2}$ and the corresponding weighted symbol and delivering said item of correction information $Z_i$.

In particular, the value of this coefficient is set in such a way that the information borne by $Z_i$ no longer contains any information relating to $A_{i,1}$ so that the noise affecting $Z_i$ and the received samples $R_i$ are decorrelated. Thus the information element reinjected into the input of the equalizer is "new" as compared with the received samples (it comes from the decoding process). It shall be called "extrinsic information".

According to an advantageous embodiment, said means for the correction of inter-symbol interference perform the following operations:

the computation of a correction value $V_i = \gamma_1 |Z_i|$, where $\gamma_1$ is a positive coefficient and where $|\ |$ represents the absolute value operator;

for each arm of the lattice corresponding to said convolutive code, the determining of a detected symbol $A_{i,o}$, comprising the following steps:

if the symbol assigned to said branch has the same sign as said item of correction information $Z_i$, the subtraction, from the metric associated with said arm, of said correction value $V_i$;

if the symbol assigned to said arm has a sign opposite that of said item of correction information $Z_i$, the addition, to the metric associated with said arm, of said correction value $V_i$;

the subtraction, from said detected symbol $A_{i,o}$, of the value $\gamma_i Z_i$.

An object of the latter subtraction is to "rid" the output of the symbol detector and hence, all the more so, the input of the convolutive decoder, of the information element carried by $Z_i$.

The weighting of the symbols transmitted on the channel is aimed, conventionally, at representing the inter-symbol interference. The weighting coefficients may be fixed or, preferably, estimated, for example by means of a learning sequence.

Preferably, said coefficient $\gamma_1$ depends on at least one of the items of information belonging to the group comprising:

the signal-to-noise ratio;

the number i of the module considered.

Indeed it can be seen that the greater the value of $\gamma_1$, the more reliable is the output of the decoder.

When the symbols are subjected to interleaving at transmission, the decoder preferably comprises:

de-interleaving means providing for the symmetrical operation of said interleaving, inserted between said correction means and said decoding means; and interleaving means providing for an interleaving of said items of correction information that is identical to said interleaving at transmission.

The interleaving and de-interleaving may be done by means of matrices.

The reading and writing increments may be fixed or, more advantageously, may depend on the read or write address.

The invention also relates to a detection and decoding module designed to be implemented in a device for the reception of signals formed by a series of digital symbols corresponding to the convolutive encoding of items of source digital data, said device comprising at least two cascade-connected modules, the module having two inputs, one symbol input $R_i$ and one correction input $Z_i$, and three outputs, one symbol output $R_{i+1}$, one correction output $Z_{i+1}$ and one decoded symbol output $D_{i+1}$, and comprising:

means for the correction of inter-symbol interference supplied by said symbol input $R_i$ and taking account of said correction input $Z_i$ and delivering estimated symbols $A_{i,1}$, means for the decoding of said estimated symbols $A_{i,1}$, performing operations symmetrical to said convolutive encoding and delivering decoded symbols $A_{i,2}$, and means for the computation of an item of correction information $Z_{i+1}$ from said estimated symbol $A_{i,1}$ and said decoded symbol $A_{i,2}$, the symbol output $R_{i+1}$ being equal to the symbol input $R_i$ delayed by a predefined latency time, the correction output $Z_{i+1}$ delivering said correction information, and the decoded symbol output $D_{i+1}$, being supplied with said decoded symbol $A_{i,2}$ or with a value reconstituted as a function of the code implemented.

As indicated here above, a module of this kind in particular may take the form of an integrated circuit.

The invention further relates to a method for the reception of signals formed by a series of digital symbols corresponding to the convolutive encoding of items of source digital data comprising the following steps:

supplying with received symbols $R_i$;

the correction of inter-symbol interference affecting each of said received symbols, by means of an item of correction information $Z_i$, and the delivery of estimated symbols $A_{i,1}$;

the decoding of said estimated symbols $A_{i,1}$, entailing operations symmetrical to said convolutive encoding, and the delivery of decoded symbols $A_{i,2}$;

the computation of said items of correction information $Z_i$ from at least one of said estimated symbols $A_{i,1}$ and at least one of said decoded symbols $A_{i,2}$.

The invention can be applied, as indicated here above, to all systems of digital transmission implementing a convolutive error correction encoding operation as shown in FIG. 1.

This system has a digital source 11 that must be transmitted to an addressee 12.

The term « digital source » is understood to mean any useful digital signal (sound, image, data) and more generally any set of useful signals, for example time-division multiplexed and/or frequency-division multiplexed signals. The addressee 12 may be a single addressee (in the case of transmission) or a multiple addressee (in the case of broadcasting). Similarly, the transmission line may of course be one-way (as in radio broadcasting) or two-way (as in radio communications for example).

The source of signal is first of all subjected to a convolutive encoding 13 of a type known per se. It may consist, in particular, of a standard systematic convolutive encoding associating, with each item of source data, at least one determined value by the combination of this item of data with at least one of the previous items of source data.

It may also be a code such as one of those described in the patent application FR 91 05278. These codes, known as "pseudo-systematic" codes, are characterized by the fact that the source data is transmitted systematically, in conjunction with at least one encoded item of data or redundancy symbol.

Any other convolutive code may also be used.

The items of data delivered by the encoder 13 are then advantageously (although this is not an obligatory characteristic) subjected to an interleaving operation 14.

This interleaving operation may be obtained conventionally by means of an interleaving matrix in which the items of source data are introduced line by line and restored column by column.

The module 14 provides for matrix interleaving. The items of data are written, in successive lines, in a memory with a size $n_E \times n_E$, and restored in successive columns. This technique is described for example in the article by E. Dunscombe and F. C. Piper, "Optimal interleaving scheme for convolutional coding", in "Electronics Letters", Vol. 25, No. 22, October 1989.

As can be seen in this article, the efficiency of the interleaving for small values of $n_E$ (some tens) is improved if the succession of rows and columns occurs according to an increment greater than 1, this increment being, by necessity, relatively prime with $n_E$.

An additional improvement to this technique of interleaving may be implemented. For it appears to be advantageous that the row-skip increment, which is always relatively prime with $n_E$, should be a function of the position of the column considered. This makes it possible to break the rectangular-positioned error packets.

In this case, the interleaving matrix read increments are chosen in such a way that the minimum distance at output between two symbols that are neighboring at input is as great as possible. These increments may, for example, be determined empirically.

Other interleaving techniques may of course be used, especially the usual method of write and read increments equal to 1, without departing from the framework of the invention. It is also clear that the rows and columns may be inverted.

Then, the interleaved signal is transmitted through the transmission channel 15. It therefore undergoes a modulation and a filtering operation 16, according to any appropriate technique, and is then transmitted through the transmission medium 17.

This transmission medium 17 is generally noise-infested and shows interference between the symbols transmitted in it.

It must be noted that, according to the invention, the two sources of disturbance namely noise and inter-symbol interference (IES) are considered in a dissociated manner. In other words, the symbols affected by IES are in addition noise-infested. The IES is chiefly due to distortion introduced by the filtering elements of the transmission system and the presence of multiple paths induced by the physical medium of transmission (due to reflections and obstacles, etc.). These phenomena lead to disturbances between symbols. The noise induced by the physical medium gets added to this IES phenomenon and is likely in addition to modify the items of information borne by the symbols.

Figure 2:
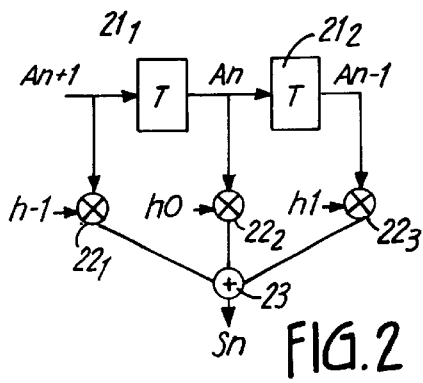
FIG. 2 shows a simplified view of a discrete model, equivalent in terms of baseband to a transmission channel affected by an inter-symbol interference, illustrating the approach of the present invention.

FIG. 2 illustrates this approach in the simplified case of interference relating to two symbols.

The reference An is given to the symbol transmitted at the instant nT, where 1/T is the speed of modulation (T being the duration of the symbol). The received signal Sn can be written, after passage in the transmission channel:

$$S_n = \Sigma_k h_k A_{n-K}$$

This signal comprises a term dependent on the symbol $A_n$, namely $h_0 A_n$, but also a term dependent on the symbols transmitted prior to and subsequently to $A_n$. This second term is the inter-symbol interference term. It can be written in the form $\Sigma_{k \neq 0} h_k A_{n-k}$. It is due to the filtering introduced by the channel and may be modelled by a lattice with $N=2^\upsilon$ states, for an IES modelled by a discrete equivalent channel with a memory $\upsilon$ (two in the case of FIGS. 2 and 3).

In the case of FIG. 2, interference relating to two symbols ($A_{n-1}$ and $A_{n+1}$) is considered. The effect of the channel may then be represented by two delay cells $21_1$ and $21_2$, each with a duration T.

When the symbol An+1 is presented at input of the cell $21_1$, the output of this cell $21_1$ is $A_n$ and the output of the second cell $21_2$ is $A_{n-1}$. The filtering of the channel amounts to the multiplying ($22_1$ to $22_3$) of each of these symbols by the corresponding filtering coefficient $h_i$. The corresponding terms are then added up (23) to form the signal $S_n$.

Figure 3:
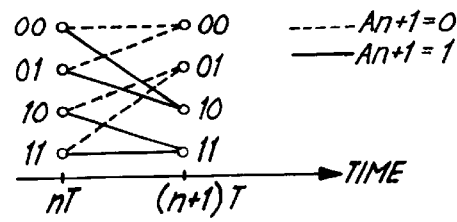
FIG. 3 shows the corresponding lattice of the channel of FIG. 2, illustrating possible developments of the state of the channel as a function of time.

The architecture of FIG. 2 corresponds to a convolutive encoding with $\upsilon=2$, the decoding lattice of which is illustrated in FIG. 3, conventionally, this lattice illustrates the possible transitions as a function of the two preceding values depending on whether the value of $A_{n+1}$ is 1 (solid lines) or 0 (dashes).

Returning to FIG. 1, the noise-infested signal $S_n$ is subjected to a filtering and a demodulation 18, which are symmetrical to the operations performed by the module 16.

Then, conventionally, the signal is equalized (19) by the application of a filtering operation designed to compensate for the effects of the transmission medium 17. The equalized signal is then de-interleaved (110) symmetrically to the interleaving operation 14.

Finally, the signal is transmitted to a convolutive decoder 111 which, for example, implements an operation of maximum likelihood decoding such as the Viterbi algorithm to deliver decoded items of data to the addressee 12.

The essential characteristic of the invention is the iterative association of a symbol detection module with weighted outputs and a decoding module, also with weighted outputs. If we consider the effect of the channel according to the approach presented, the standard equalization (the filtering of the received signal by means of a transversal filter, for example) is replaced by an operation of symbol detection that takes account of the memory effect introduced by the channel.

Thus, the proposed device includes a detector with weighted input and output that estimates the symbols $A_n$ from the noise-infested output of the channel. For example, this detector may be made by using the algorithm described in the patent document FR 91 05279. It requires knowledge of the coefficient $h_k$ which should therefore be estimated externally to the proposed device, for example by means of learning sequences.

Figure 4:
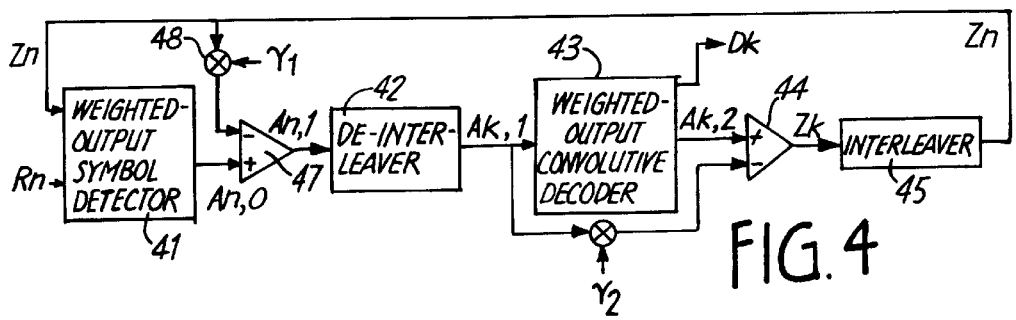
FIG. 4 is a block diagram showing the principle of the receiver of the present invention.

FIG. 4 illustrates the general principle of the invention.

Each received sample $R_n$, which corresponds to the noise-infested output of the transmission channel, is processed as follows:

a detector 41 of symbols with weighted outputs produces an estimation $A_{n,1}$ of the corresponding transmitted symbol;

the symbols $A_{n,1}$ at output of the detector 41 are de-interleaved (42) to give the symbols $A_{k,1}$;

the de-interleaved symbols $A_{k,1}$ are presented to the input of a convolutive decoder 43 which gives a new estimation $A_{k,2}$ of symbols $A_k$;

at output of the decoder 43, there is defined (44) a correction data element $Z_k$ called an extrinsic data element obtained from the estimations $A_{k,1}$ and $A_{k,2}$;

the correction data element $Z_k$ is then used, after a re-interleaving operation 45, in the detector 41.

More specifically, in the embodiment described, the item of data $Z_k$ is obtained by difference between $A_{k,2}$ and $\gamma_2 A_{k,1}$ delivered by the multiplier 46, where $\gamma_2$ is a positive coefficient, $Z_n$ is still an estimation of the symbol $A_n$, but this time affected by a noise that is not correlated with the noise that affects $A_{n,1}$ and is slightly correlated with the noise affecting $R_n$ by means of the interleaving function 45.

The extrinsic information $Z_n$ is then used by the detector 41 by the addition or deduction, to or from each arm metric of the lattice associated with the channel (cf. FIG. 3), of the term $\gamma_1|Z_n|$, where $\gamma_1$ is a positive coefficient. The term $\gamma_1|1|Z_n|$ is deducted (or added respectively) when the symbol assigned to the arm considered has the same sign as $Z_n$ (or respectively the opposite sign). The value of the coefficient $\gamma_1$ depends on both the signal-to-noise ratio and the reliability of the extrinsic information element $Z_{n'}$.

The extrinsic information element, assigned the coefficient $\gamma_1$ for the multiplier 48, is furthermore deducted (47) from the output of the detector 41 before being presented to the input of the decoder 43. Indeed, since the extrinsic information element $Z_n$ has been produced by the decoder 43, it cannot be reused by this decoder 43.

The symbol detector 41 takes its decisions according to a Viterbi type algorithm. All the operations performed by this detector correspond to those described in the patent FR 91 05279. The difference, as compared with a convolutive decoding algorithm, lies in the computation of the transition metrics or branch metrics, which is done differently.

Each node of the lattice is represented by a possible state of the channel at a given instant nT. For an IES value relating to K1 symbols subsequent to the symbol considered and K2 symbols prior to the symbols considered, namely for:

$$S_n = \Sigma_{k=K1 \text{ to } K2} h_k A_{n-k}$$

the state of the channel at t=nT is given by the (K1+K2)-uplet$(A_{n+K1-1} \ldots A_{n+1} A_n A_{n-1} \ldots A_{n-K2})$. The knowledge of the state of the channel at t=nT as well as the value of $A_{n+K1}$ (symbol « entering » the channel) then provides knowledge of its state at t=(n+1)T.

Thus, for each node j of the lattice taken at the instant t=nT, two transition metrics $L_j 0$ and $L_j 1$ are computed. They correspond to the two possible transitions ($A_{n+K1}=0$ and $A_{n+K1}=1$). They have the form:

$$L_j 0 = (R_n - R_j 0)2 \text{ and } L_j 1 = (R_n - R_j 1)2$$

where $R_n$ represents the sample actually received at input of the detector and $R_j 0$ (or $R_j 1$ respectively) is the theoretical value of the sample that is not noise-infested when the state of the channel corresponds to the node j of the lattice and when $A_{n+K1}=0$ (or $A_{n+K1}=1$ respectively). $R_j 0$ (or $R_j 1$ respectively) therefore has the form: $\Sigma_{k=K1 \text{ to } K2} h_k A_{n-k}$. If $A_{n+K1}=0$, then the value is $R_j 0$ and if $A_{n+K1}=1$ then the value is $R_j 1$.

In practice, the following simplified expression is used to compute the metrics:

$$L_j 0 = |R_n - R_j 0| \text{ and } L_j 1 = |R_n - R_j 1|$$

The performance characteristics of the detection are then very close to those obtained with the previous expression and the implantation of the computation on silicon is greatly simplified.

Apart from this computation of the metrics, the computation algorithm is similar in principle as well as in its implementation to a convolutive decoding algorithm.

In practice, the receiver shown in FIG. 4 induces a computation latency (processing time of the detector 41, the decoder 43, the interleaving operation 45 and the de-interleaving operation 42). It is therefore not possible to obtain instantaneous knowledge of $Z_n$ when $R_n$ is received in the detector 41. Consequently, according to an essential characteristic of the invention, the process implemented is iterative.

Figure 5:
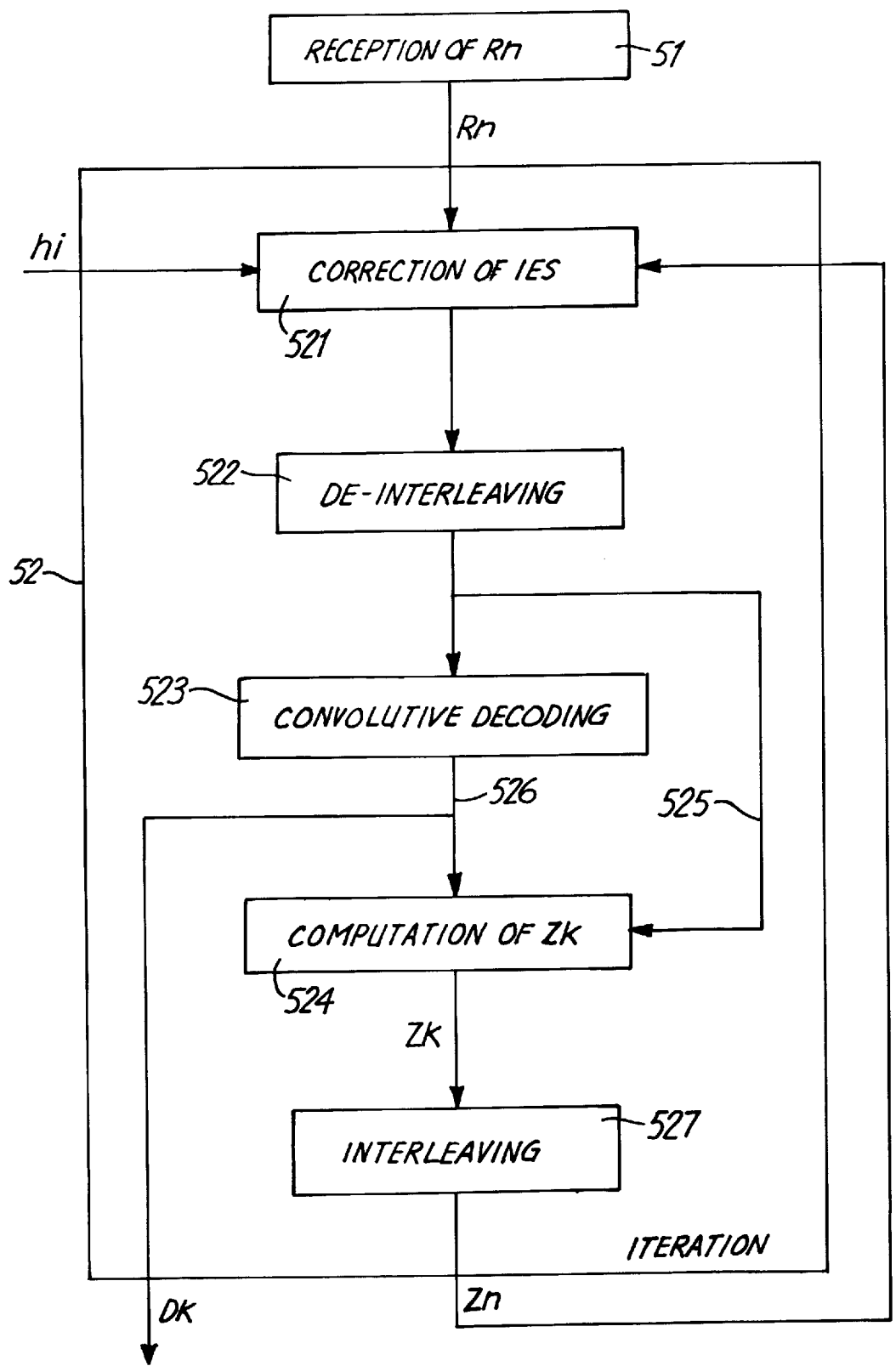
FIG. 5 is a simplified flow chart illustrating the method of the present invention implemented in the receiver of FIG. 4.

This process is illustrated schematically by FIG. 5. For each symbol received Rn (reception step 51), at least two iterations 52 are performed.

Each iteration 52 includes a step 521 for the correction of inter-symbol interference. As indicated here above, this correction implements a convolutive decoding technique and takes account of an item of extrinsic correction information $Z_n$ and items of data $h_i$ representing the transmission channel.

The items of information $Z_n$ are computed during the step 524. Naturally, at the first iteration, no particular value of $Z_n$ is known. Consequently, this value is set at a neutral value, namely at a value having no effect on the computations.

After the correction 521, the estimated symbols are de-interleaved during the de-interleaving step 522 (if an interleaving operation has been implemented at transmission) and then decoded according to a standard technique of convolutive decoding 523 and for example according to the technique described in the French patent application FR 91 02579.

Then, the item of extrinsic information $Z_k$ is computed (524) from the item of data 525 detected by the correction step 521 and the item of data 526 decoded by the decoding step 523. Then, the items of information $Z_k$ are re-interleaved (527) symmetrically with the de-interleaving 522 to give the item of information $Z_n$. The item of information $Z_n$ is taken into account in the correction step 521 of the next iteration.

At the last iteration, the step 524 for the computation of $Z_k$ is not implemented. The decoded symbol $D_k$ is delivered by the decoding step 523.

Figure 6:
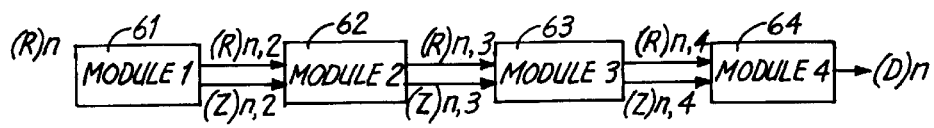
FIG. 6 illustrates the modular structure of the receiver of the present invention in the case of four cascade-connected modules.

The corresponding reception device may advantageously be made in a modular fashion, by associating one module with each iteration. FIG. 6 illustrates a device of this kind comprising four modules.

The first module 61 of the system receives $(R)_n$, the symbol received by the device and delivers firstly $(R)_{n,2}$, which is equal to $(R)_n$ assigned a delay corresponding to the latency of the module and, secondly, $(Z)_{n,2}$ the extrinsic information computed by the module 61. Each of the following modules 62 to 64 receives the delayed symbol $(R)_{n,i}$ and the item of extrinsic information $(Z)_{n,i}$. The last module 64 delivers the decoded symbol $(D)_n$.

It will easily be understood that the performance characteristics of the device in terms of error rate are a function of the number of cascade-connected modules.

Figure 7:
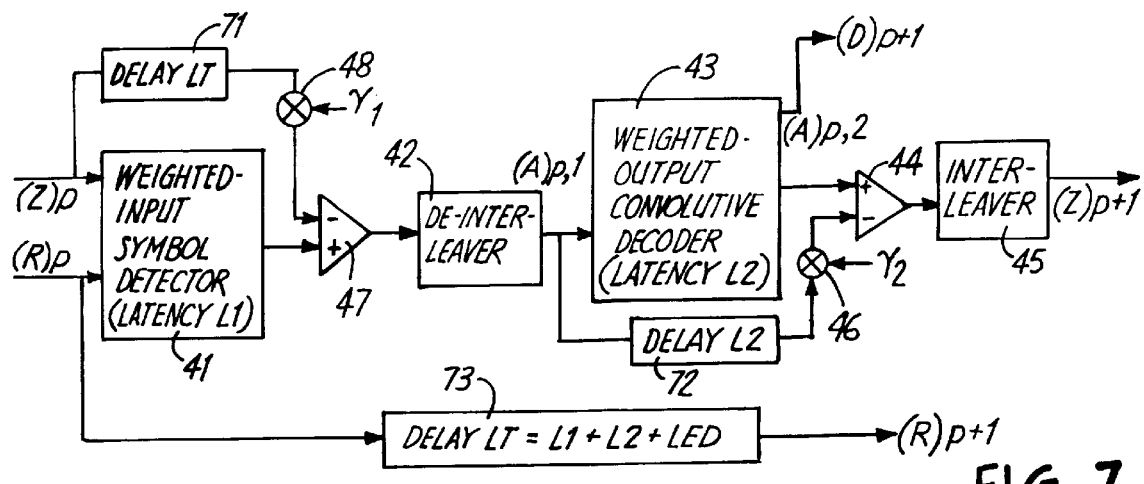
FIG. 7 shows a block diagram of the module of FIG. 6.

Advantageously, all the modules are identical. FIG. 7 illustrates an exemplary embodiment of a module of this kind. More specifically, it is the module corresponding to the $p^{th}$ iteration. It includes:

two inputs: $(R)_p$ and $(Z)_p$, three outputs: $(R)_{p+1}$, $(Z)_{p+1}$ and $(D)_{p+1}$.

The input $(R)_p$ is equal to the output of the channel delayed by the latency of p−1 modules.

The input $(Z)_p$ comes from the previous module and is set, for p=1, at a neutral value, namely a value that has no influence on the output of the detector.

The output $(R)_{p+1}$, equal to the input $(R)_p$ delayed by the latency of a module, is unused if the iteration is the last one of the process (p=P, P being the total number of modules).

The output $(Z)_{p+1}$ is the extrinsic information element prepared at the $p^{th}$ iteration. This output is also unused if p=P.

The output $(D)_{p+1}$ which is the decoded item of data is unused by the P−1 first modules, and only the items of data coming from $(D)_{p+1}$ are given to the addressee.

The elements of this module that have already been described with reference to FIG. 4 are not described again, and bear the same references. It will be noted that, as compared with the schematic diagram of FIG. 4, different delays are added to take account of the latencies of the different elements.

Thus, the extrinsic information $(Z)_p$ used for the difference 47 must be delayed (71) by a duration equal to the latency $L_1$ of the detector 41. This is also the case with $(A)_{p,1}$ which must be delayed by the latency $L_2$ of the decoder 43. Finally, $(R)_p$ must be delayed (73) by the total latency introduced by a module $L_T$ in order that $(R)_{p+1}$ and $(Z)_{p+1}$ may be presented at the same instant to the input of the following module. This latency $L_T$ is equal to the sum of the latency of the detector 41, $L_1$, the latency of the decoder $L_2$ and the latency introduced by the interleaving operations 45 and de-interleaving operations 42 $L_{ED}$.

Figure 8:
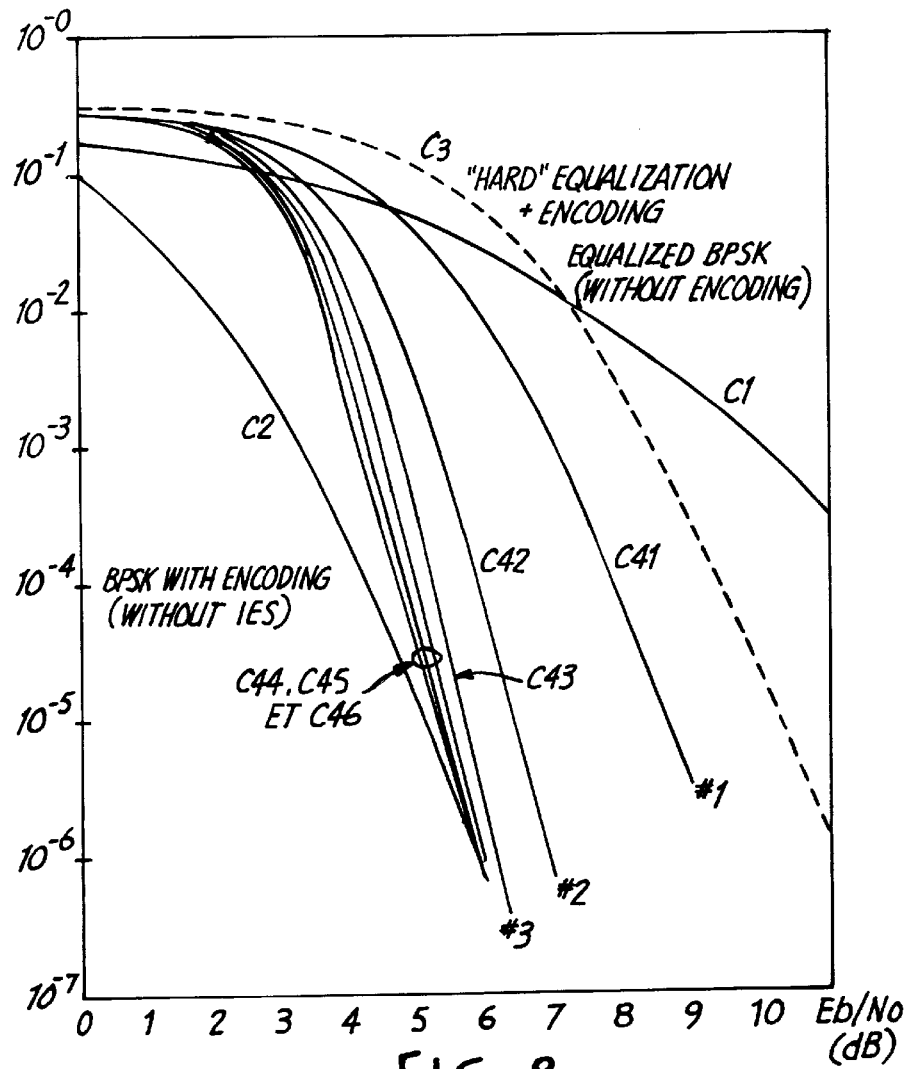
FIG. 8 shows a series of curves illustrating the performance characteristics of the present invention in the case of a Gaussian channel.

The performance characteristics of the device of the invention have been simulated and are illustrated in FIG. 8. The item of source data is encoded by a recursive systematic convolutive code (CSR code) with a constraint length K=5 and efficiency R=½. The encoded items of data are sent on the transmission channel after a non-uniform interleaving in a matrix of 64 rows and 64 columns. The modulation used is a binary phase-shift keying (BPSK) modulation.

The multiplier coefficients $h_i$ are real and constant and known to the symbol detector but the principle is applicable when they are complex and variable. For the results presented hereinafter, the coefficients $h_i$ have been fixed at:

$h_0=\sqrt{0.45}$, $h_1=\sqrt{0.25}$, $h_2=\sqrt{0.15}$, $h_3=\sqrt{0.10}$, $h_4=\sqrt{\sqrt{0.05}}$ They verify $\Sigma_{i=0 \text{ to } 4} h_i 2=1$. The transmission channel is also disturbed by a Gaussian white additional noise.

At output of the channel, the received samples Rn are quantified on 8 bits. The symbol detector and the channel decoder use the algorithm presented in the patent FR 91 05279. The working of the decoder is also represented by a 16-state lattice. The values of coefficients $\gamma_1$ and $\gamma_2$ have been determined empirically.

The results shown use four modules. The curves $C_1$ and $C_2$ represent the error rate at output of the transmission system, respectively without and with channel encoding, when there is no inter-symbol interference: $C_3$ gives the error rate in the classic case where the symbol detector gives a binary decision (firm decision) and the curves $C_{4i}$ show the results obtained with the proposed device after the i-order iteration.

These curves therefore show that, at an error rate of $10^{-5}$, the use of a symbol detector with weighted output makes it possible to gain 1.6 dB as compared with a firm decision detector and the three additional iterations provide an additional gain of about 3 dB. When the number of iterations increases, the performance characteristics approach those obtained on an encoded Gaussian channel.

What is claimed is:

1. Device for the reception of signals formed by a series of digital symbols corresponding to the convolutive encoding of items of source digital data characterized in that it comprises:

p cascade-connected detection and decoding modules $M_1$ to $M_p$, p being greater than or equal to 2, each of said modules $M_i$ including:

inter-symbol interference correction means supplied by a symbol input $R_i$ and delivering estimated symbols $A_{i,1}$ with weighted values;

means for the decoding of said estimated symbols $A_{i,1}$ performing operations symmetrical to said convolutive encoding and delivering decoded symbols $A_{i,2}$ with weighted values; and means for the computation of an item of correction information $Z_{i+1}$ from said estimated symbol $A_{i,1}$ and said decoded symbol $A_{i,2}$, said means for the correction of each of said modules $M_i$, except for the first module $M_1$, taking account of at least one item of correction information $Z_i$ determined by the previous module $M_{i-1}$.

2. Device according to claim 1, characterized in that:

each of said modules $M_i$ has two inputs, one symbol input $R_i$ and one correction input on which correction information $Z_i$ may be received, and three outputs, one symbol output $R_{i+1}$, one correction output and one decoded symbol output $D_{i+1}$;

the symbol input $R_i$ of the module $M_i$ being connected to the symbol output $R_i$ of the module $M_{i-1}$ or i greater than 1 and being supplied with the symbols received for i equal to 1;

the correction input of the module $M_i$ being connected to the correction output of the module $M_{i-1}$ for i greater than 1 and being supplied with a neutral value that does not affect the correction for i equal to 1;

the symbol output $R_{i+1}$ of the module $M_i$ being equal to the symbol input $R_i$ of said module $M_i$ delayed by the latency time dictated by the module $M_i$;

the correction output delivering said correction information; and the decoded symbol output $D_{i+1}$ being unused for the modules $M_1$ to $M_{p-1}$ and being supplied with the decoded symbol $A_{p,2}$ of the module $M_p$ if the code implemented is a systematic code and, if not, with a corresponding reconstituted value.

3. Device according to any of the claims 1 and 2, characterized in that said means (41) for the correction of the inter-symbol interference are supplied with an item of correction information $Z_i$ representing a difference (44) between each decoded symbol $A_{i,2}$ and the corresponding estimated symbol $A_{i,1}$.

4. Device according to claim 3, characterized in that said means to compute the item of correction information comprise means (46) for the multiplication of said estimation symbols $A_{i,1}$ by a positive weighting coefficient $\gamma_2$ delivering weighted symbols, and subtraction means (44) computing the difference between each decoded symbol $A_{i,2}$ and the corresponding weighted symbol and delivering said item of correction information $Z_i$.

5. Device according to any of the claims 1 to 4, characterized in that said means (41, 47, 48) for the correction of inter-symbol interference perform the following operations:

the computation (41) of a correction value $V_i=\gamma_1|Z_i|$, where $\gamma_1$ is a positive coefficient and where $|\ |$ represents the absolute value operator;

for each arm of the lattice corresponding to said convolutive code, the determining (41) of a detected symbol $A_{i,0}$, comprising the following steps:

if the symbol assigned to said branch has the same sign as said item of correction information $Z_i$, the subtraction, from the metric associated with said arm, of said correction value $V_i$;

if the symbol assigned to said arm has a sign opposite that of said item of correction information $Z_i$, the addition, to the metric associated with said arm, of said correction value $V_i$;

the subtraction (47), from said detected symbol $A_{i,0}$, of the value $\gamma_i Z_i$.

6. Device according to claim 5, characterized in that said coefficient $\gamma_1$ depends on at least one of the items of information belonging to the group comprising:

the signal-to-noise ratio;

the number i of the module considered.

7. Device according to any of the claims 1 to 6, applied to the reception of symbols subjected to an interleaving operation at transmission, characterized in that it comprises:

de-interleaving means (42) providing for the symmetrical operation of said interleaving, inserted between said correction means and said decoding means; and interleaving means (45) providing for an interleaving of said items of correction information that is identical to said interleaving at transmission.

8. Detection and decoding module designed to be implemented in a device for the reception of signals formed by a series of digital symbols corresponding to the convolutive encoding of items of source digital data, said device comprising at least two cascade-connected modules, characterized in that it has two inputs, one symbol input $R_i$ and one correction input $Z_i$, and three outputs, one symbol output $R_{i+1}$, one correction output $Z_{i+1}$ and one decoded symbol output $D_{i+1}$, and in that it comprises:

means (41, 47, 48) for the correction of inter-symbol interference, supplied by said symbol input $R_i$ and taking account of said correction input $Z_i$ and delivering estimated symbols $A_{i,1}$, means (43) for the decoding of said estimated symbols $A_{i,1}$, performing operations symmetrical to said convolutive encoding and delivering decoded symbols $A_{i,2}$, and means (44, 46) for the computation of an item of correction information $Z_{i+1}$ from said estimated symbol $A_{i,1}$ and said decoded symbol $A_{i,2}$, the symbol output $R_{i+1}$ being equal to the symbol input $R_i$ delayed by a predefined latency time, the correction output $Z_{i+1}$ delivering said correction information, and the decoded symbol output $D_{i+1}$ being supplied with said decoded symbol $A_{i,2}$ or with a value reconstituted as a function of the code implemented.

9. Method for the reception of signals formed by a series of digital symbols corresponding to the convolutive encoding of items of source digital data comprising the following steps:

supplying with received symbols $R_i$; and performing at least two iterations of the following steps:

correcting inter-symbol interference affecting each of said received symbols, by means of an item of correction information $Z_i$, and the delivery of estimated symbols $A_{i,1}$;

decoding said estimated symbols $A_{i,1}$ entailing operations symmetrical to said convolutive encoding, and the delivery of decoded symbols $A_{i,2}$; and computing said items of correction information $Z_i$ from at least one of said estimated symbols $A_{i,1}$ and at least one of said decoded symbols $A_{i,2}$.

* * * * *

UNITED STATES PATENT AND TRADEMARK OFFICE
CERTIFICATE OF CORRECTION

Page 1 of 2

PATENT NO. : 6,108,388
APPLICATION NO. : 08/894207
DATED : August 22, 2000
INVENTOR(S) : Catherine Douillard et al.

It is certified that error appears in the above-identified patent and that said Letters Patent is hereby corrected as shown below:

In the Claims

In column 14, lines 21 through 36:
For Claim 9, please delete:

"Method for the reception of signals formed by a series of digital symbols corresponding to the convolutive encoding of items of source digital data comprising the following steps:
 supplying with received symbols $R_i$; and
 performing at least two iterations of the following steps:
  correcting inter-symbol interference affecting each of said received symbols, by means of an item of correction information $Z_i$, and the delivery of estimated symbols $A_{i,1}$ ;
  decoding said estimated symbols $A_{i,1}$ entailing operations symmetrical to said convolutive encoding, and the delivery of decoded symbols $A_{i,2}$ ; and
  computing said items of correction information $Z_i$ from at least one of said estimated symbols $A_{i,1}$ and at least one of said decoded symbols $A_{i,2}$."

and insert:

--Method for the reception of signals formed by a series of digital symbols corresponding to the convolutive encoding of items of source digital data comprising the following steps:
 supplying with received symbols $R_i$; and
 performing for each received symbol $R_i$ at least two iterations of the following steps:
  correcting inter-symbol interference affecting received symbols $R_i$, by means of an item of correction information $Z_i$, said correction information $Z_i$ except $Z_1$ (first iteration), being computed by a computing step of the previous iteration, and the delivery of corresponding estimated symbols $A_{i,1}$ with weighted value;

Signed and Sealed this
Twenty-eighth Day of July, 2015

Michelle K. Lee
*Director of the United States Patent and Trademark Office* decoding said estimated symbols $A_{i,1}$ with weighted value entailing operations symmetrical to said convolutive encoding, and the delivery of decoded symbols $A_{i,2}$ with weighted value;

computing said correction information $Z_i$ from at least one of said estimated symbols $A_{i,1}$ and at least one of said decoded symbols $A_{i,2}$; and delivering said correction information $Z_i$ to the step of correcting inter-symbol interference of the following iteration.--